US012764981B2

(12) United States Patent
Bolotnikov

(10) Patent No.: US 12,764,981 B2
(45) Date of Patent: Oct. 13, 2026

(54) DIODES INCLUDING MULTIPLE SCHOTTKY CONTACTS

(71) Applicant: SEMICONDUCTOR COMPONENTS INDUSTRIES, LLC, Phoenix, AZ (US)

(72) Inventor: Alexander Viktorovich Bolotnikov, Niskayuna, NY (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 1120 days.

(21) Appl. No.: 17/805,824

(22) Filed: Jun. 7, 2022

(65) Prior Publication Data

US 2023/0395730 A1 Dec. 7, 2023

(51) Int. Cl.
*H10D 8/60* (2025.01)
*H10D 8/01* (2025.01)
(Continued)

(52) U.S. Cl.
CPC ............... *H10D 8/60* (2025.01); *H10D 8/051* (2025.01); *H10D 62/109* (2025.01); *H10D 62/8325* (2025.01)

(58) Field of Classification Search
CPC ...... H10D 8/60; H10D 8/051; H10D 62/8325; H10D 64/64; H10D 62/106
See application file for complete search history.

(56) References Cited

U.S. PATENT DOCUMENTS 6,362,495 B1 * 3/2002 Schoen ............... H10F 77/1226 257/77
2005/0194610 A1 * 9/2005 Souma ..................... H10D 8/60 257/133

(Continued)

FOREIGN PATENT DOCUMENTS

JP 2000196107 A 7/2000

OTHER PUBLICATIONS

International Search Report and Written Opinion for PCT Application No. PCT/US2023/066435, mailed on Aug. 4, 2023, 10 pages.

(Continued)

*Primary Examiner* — Yu-Hsi D Sun
(74) *Attorney, Agent, or Firm* — Brake Hughes Bellermann LLP

(57) ABSTRACT

In some aspects, a diode can include: a substrate and semiconductor layer of a first conductivity type, the semiconductor layer being disposed on the substrate and including a drift region; a shield region of a second conductivity type disposed in the semiconductor layer adjacent to the drift region; a first Schottky material disposed on at least a portion of the shield region and on a first portion of the drift region, the first Schottky material defining a first Schottky contact with an upper portion of the drift region; and a second Schottky material disposed on a second portion of the drift region, the second Schottky material being adjacent to the first Schottky material, the second Schottky material defining a second Schottky contact with the upper portion of the drift region, the first Schottky contact having a barrier height that is less than a barrier height of the second Schottky contact.

20 Claims, 6 Drawing Sheets

(51) Int. Cl.
*H10D 62/10* (2025.01)
*H10D 62/832* (2025.01)

(56) References Cited

U.S. PATENT DOCUMENTS

| | | | |
|---|---|---|---|
| 2008/0203517 | A1 | 8/2008 | Rueb et al. |
| 2010/0289109 | A1 | 11/2010 | Henning et al. |
| 2012/0043551 | A1 | 2/2012 | Zhu et al. |
| 2022/0020884 | A1 | 1/2022 | Rascuná |

OTHER PUBLICATIONS

K. J. Schoen et al., "A Dual-Metal-Trench Schottky Pinch-Rectifier in 4H—SiC," IEEE Electron Device Letters, vol. 19, No. 4, Apr. 1998.

Fabrizio Roccaforte et al., "Silicon Carbide Pinch Rectifiers Using a Dual-Metal Ti—N12Si Schottky Barrier," IEEE Transactions on Electron Devices, vol. 50, No. 8, Aug. 2003.

* cited by examiner

DIODES INCLUDING MULTIPLE SCHOTTKY CONTACTS

TECHNICAL FIELD

This description relates to diodes that include multiple Schottky contacts with different respective barrier heights.

BACKGROUND

Semiconductor materials, e.g., silicon (Si) silicon carbide (SiC), gallium nitride (GaN) used to produce high-power semiconductor devices are subject to the presence of high electric fields during operation of associated semiconductor devices, which can operate at 400 volts (V), 600 V, 1200 V, or higher. Schottky diodes utilizing such a power semiconductor materials (e.g., SiC), due to such high electric fields under reverse-biased conditions, can experience leakage currents that approach, or exceed acceptable operating limits. This is due, in part, to the fact that there is a tradeoff between forward-operating characteristics of a Schottky diode, and its reverse-bias leakage current. That is, improving forward-operating characteristics of a Schottky diode, such as reducing conduction losses by reducing forward voltage drop ($V_f$), results in an increase in leakage current of the diode. Accordingly, in previous approaches, in order to reduce on-state conduction losses (e.g., reduce $V_f$), designers must sacrifice a diode's reverse characteristics, which can result in leakage currents exceeding acceptable values. Conversely in previous approaches, in order to improve a diode's reverse characteristic (e.g., reduce leakage), designers must sacrifice a diode's forward operating characteristics.

SUMMARY

In some aspects, the techniques described herein relate to a diode including: a substrate of a first conductivity type; a semiconductor layer of the first conductivity type disposed on the substrate, the semiconductor layer including a drift region of the diode; a shield region of a second conductivity type disposed in the semiconductor layer adjacent to an upper portion of the drift region; a first Schottky material disposed on at least a portion of the shield region and on a first portion of the upper portion of the drift region, the first Schottky material defining a first Schottky contact with the drift region; and a second Schottky material disposed on a second portion of the drift region, the second Schottky material being adjacent to the first Schottky material, the second Schottky material defining a second Schottky contact with the drift region, the first Schottky contact having a first barrier height, the second Schottky contact having a second barrier height, the first barrier height being less than the second barrier height.

In some aspects, the techniques described herein relate to a diode, further including: a third Schottky material disposed on a third portion of the drift region, the third Schottky material defining a third Schottky contact with the drift region, the third Schottky material being adjacent to the second Schottky material, the second Schottky material being disposed between the first Schottky material and the third Schottky material, the third Schottky contact having a third barrier height that is greater than the second barrier height.

In some aspects, the techniques described herein relate to a diode, wherein: the first conductivity type is n-type; and the second conductivity type is p-type.

In some aspects, the techniques described herein relate to a diode, wherein: the substrate is a silicon carbide substrate; and the semiconductor layer is an epitaxial silicon carbide layer, the substrate having a doping concentration that is higher than a doping concentration of the epitaxial silicon carbide layer.

In some aspects, the techniques described herein relate to a diode, wherein the at least a portion of the shield region is a first portion of the shield region, the diode further including: a metal disposed on a second portion of the shield region and defining an ohmic contact to the shield region.

In some aspects, the techniques described herein relate to a diode, wherein the metal disposed on the second portion of the shield region includes one of: the first Schottky material; or the second Schottky material.

In some aspects, the techniques described herein relate to a diode, wherein the metal disposed on the second portion of the shield region includes at least one of: a metal silicide; or a deposited metal.

In some aspects, the techniques described herein relate to a diode including: a substrate of a first conductivity type; a semiconductor layer of the first conductivity type disposed on the substrate; a first shield region of a second conductivity type disposed in the semiconductor layer; a second shield region of the second conductivity type disposed in the semiconductor layer, the second shield region being laterally spaced from the first shield region, a drift region of the diode being disposed in the semiconductor layer and disposed, at least in part, between the first shield region and the second shield region; a first Schottky material layer having: a first portion disposed on at least a portion of the first shield region and on a first portion of the drift region, and defining a first Schottky contact with the drift region; and a second portion disposed on at least a portion of the second shield region and on a second portion of the drift region, and defining a second Schottky contact with the drift region; and a second Schottky material layer disposed on a third portion of the drift region, the second Schottky material layer being disposed, at least in part, between the first portion of the first Schottky material layer and the second portion of the first Schottky material layer, and defining a third Schottky contact with the drift region, the first Schottky contact and the second Schottky contact having a first barrier height, the third Schottky contact having a second barrier height, the first barrier height being less than the second barrier height.

In some aspects, the techniques described herein relate to a diode, further including: a third Schottky material layer having: a first portion disposed on a fourth portion of the drift region and defining a fourth Schottky contact with the drift region, the first portion of the third Schottky material layer being disposed between the first portion of the first Schottky material layer and the second Schottky material layer; and a second portion disposed on a fifth portion of the drift region and defining a fifth Schottky contact with the drift region, the second portion of the third Schottky material layer being disposed between the second portion of the first Schottky material layer and the second Schottky material layer, the fourth Schottky contact and the fifth Schottky contact having a third barrier height, the third barrier height being less than the second barrier height and greater than the first barrier height.

In some aspects, the techniques described herein relate to a diode, wherein: the first conductivity type is n-type; and the second conductivity type is p-type.

In some aspects, the techniques described herein relate to a diode, wherein: the substrate is a silicon carbide substrate; and the semiconductor layer is an epitaxial silicon carbide layer, the substrate having a doping concentration that is higher than a doping concentration of the epitaxial silicon carbide layer.

In some aspects, the techniques described herein relate to a diode, wherein the at least a portion of the first shield region is a first portion of the first shield region, the diode further including: a metal disposed on a second portion of the first shield region and defining an ohmic contact to the first shield region.

In some aspects, the techniques described herein relate to a diode, wherein the metal disposed on the second portion of the first shield region includes one of: a first Schottky material of the first Schottky material layer; or a second Schottky material of the second Schottky material layer.

In some aspects, the techniques described herein relate to a diode, wherein the metal disposed on the second portion of the first shield region includes at least one of: a metal silicide; or a deposited metal.

In some aspects, the techniques described herein relate to a diode, wherein the at least a portion of the second shield region is a first portion of the second shield region, the diode further including: a metal disposed on a second portion of the second shield region and defining an ohmic contact to the second shield region.

In some aspects, the techniques described herein relate to a method for forming a diode, the method including: forming a semiconductor layer of a first conductivity type disposed on a substrate of the first conductivity type, the semiconductor layer including a drift region of the diode; forming a shield region of a second conductivity type in the semiconductor layer adjacent to the drift region; depositing and patterning a first Schottky material on at least a portion of the shield region and on a first portion of the drift region, the first Schottky material defining a first Schottky contact with the drift region; and depositing and patterning a second Schottky material disposed on a second portion of the drift region, the second Schottky material being adjacent to the first Schottky material, the second Schottky material defining a second Schottky contact with the drift region, the first Schottky contact having a first barrier height, the second Schottky contact having a second barrier height, the first barrier height being less than the second barrier height.

In some aspects, the techniques described herein relate to a method, further including: depositing and patterning a third Schottky material on a third portion of the drift region, the third Schottky material defining a third Schottky contact with the drift region, the third Schottky material being adjacent to the second Schottky material, the second Schottky material being disposed between the first Schottky material and the third Schottky material, the third Schottky contact having a third barrier height that is greater than the second barrier height.

In some aspects, the techniques described herein relate to a method, wherein forming the semiconductor layer include forming an epitaxial semiconductor layer having a doping concentration that is less than a doping concentration of the substrate.

In some aspects, the techniques described herein relate to a method, wherein the at least a portion of the shield region is a first portion of the shield region, the method further including: depositing and patterning a metal layer on a second portion of the shield region, the metal layer defining an ohmic contact to the shield region.

In some aspects, the techniques described herein relate to a method, wherein the metal layer includes one of: the first Schottky material; or the second Schottky material.

Figure 1:
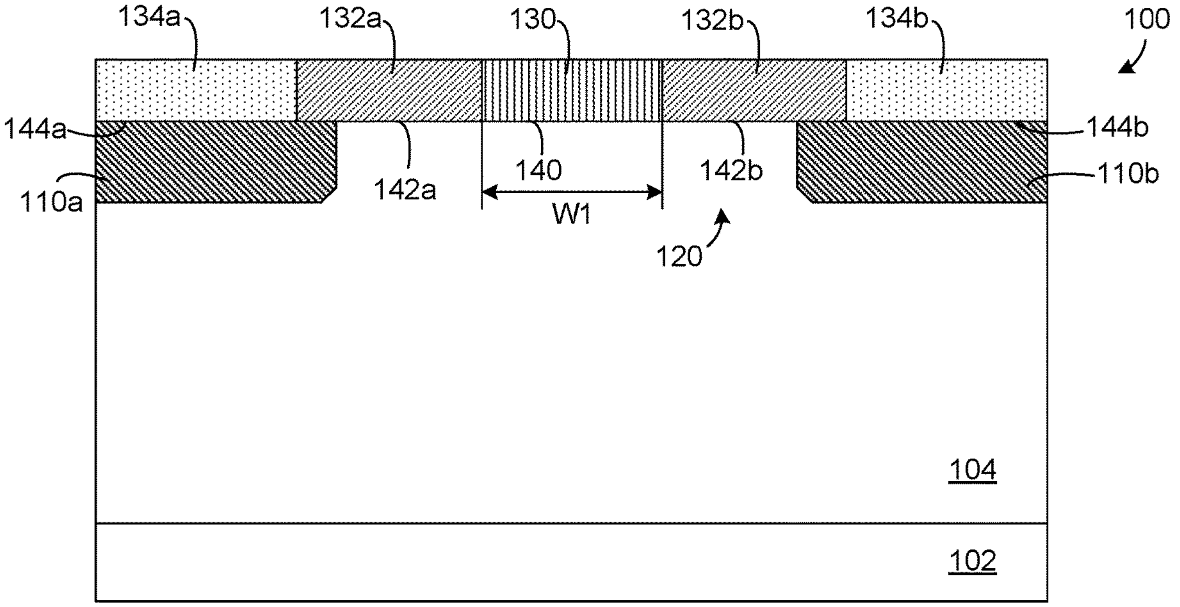
FIG. 1 is a diagram illustrating a cross-sectional view of a diode including Schottky contacts with different barrier heights, according to an implementation.

In the drawings, which are not necessarily drawn to scale, like reference symbols may indicate like and/or similar components (elements, structures, etc.) in different views. The drawings illustrate generally, by way of example, but not by way of limitation, various implementations discussed in the present disclosure. Reference symbols show in one drawing may not be repeated for the same, and/or similar elements in related views. Reference symbols that are repeated in multiple drawings may not be specifically discussed with respect to each of those drawings, but are provided for context between related views. Also, not all like elements in the drawings are specifically referenced with a reference symbol when multiple instances of that element are illustrated.

DETAILED DESCRIPTION

The present disclosure is directed to diodes with Schottky contacts (e.g., Schottky diodes), and associated methods of producing such diodes. In the approaches described herein, different materials having different, respective work functions are used to form a Schottky interface with an underlying semiconductor material (e.g., on a drift region of the diode). That is, multiple Schottky contacts with different barrier heights can be included in a Schottky interface (e.g., Schottky contact) of a diode. Said another way, in the approaches described herein, a Schottky contact of a diode can include multiple sub-contacts with different barrier heights that, together, form the Schottky contact of the diode. By locating the lower barrier sub-contact portions of the Schottky contact on portions of the drift region of the diode with lower electric fields, an effective turn-on voltage, or forward voltage drop $V_f$, of the diode can be reduced (thus on-state losses) without significantly impacting reverse blocking capabilities of the diode (e.g., without significantly increasing reverse-biased leakage current). In some implementations, both forward and reverse operating characteristics of a Schottky diode can be improved.

FIG. 1 is a diagram illustrating a cross-sectional view of a diode 100 including Schottky contacts with different barrier heights, according to an implementation. In some implementations, the diode 100 can have a linear (striped) cell layout, e.g., with the same structure and dimensions into and/or out of the page. In some implementations, the diode 100 can be cellular, such as the example shown in FIG. 3. The diode 100 illustrates a cross-sectional view of a single diode cell perpendicular to a stripe of the linear cell layout, which can be interconnected with other diode stripes or diode cells to form a larger diode (e.g., by electrically connecting the respective anodes together and by electrically connecting the respective cathodes together). Depending on the particular implementation, the spacing, sizing and arrangement of the elements of the diode 100 can be different.

As shown in FIG. 1, the diode 100 includes a substrate 102 and a semiconductor layer 104 (semiconductor region). The substrate 102 and the semiconductor layer 104 can be of a first conductivity type, e.g., n-type conductivity. The substrate 102 can have a doping concentration that is higher than a doping concentration of the semiconductor layer 104. In some implementations, the semiconductor layer 104 can be an epitaxial semiconductor layer, or can include multiple epitaxial semiconductor layers with different doping concentrations. That is, in the view of FIG. 1, the upper portion of the semiconductor layer 104 can have a doping concentration that is higher than a doping concentration of the lower portion of the semiconductor layer 104. In some implementations, the substrate 102 and the semiconductor layer 104 can include silicon carbide, or other semiconductor materials.

The diode 100 includes a shield region 110*a* and a shield region 110*b* that are disposed in the semiconductor layer 104. The shield region 110*a* and the shield region 110*b* are disposed adjacent to a drift region 120 of the diode 100, where the drift region 120 is disposed between the shield region 110*a* and the shield region 110*b*. The shield region 110*a* and the shield region 110*b* of the diode 100 are of a second conductivity type that is opposite the first conductivity type, e.g., p-type conductivity. In some implementations, the first and second conductivity types can be reversed.

The diode 100 also includes a first Schottky material 130 (a first Schottky material layer) that defines a Schottky contact 140 with the drift region 120, and a second Schottky material (a second Schottky material layer) that includes a portion 132*a* and a portion 132*b* that define, respectively, a Schottky contact 142*a* and a Schottky contact 142*b* with the drift region 120. That is, as shown in FIG. 1, the portion 132*a* is disposed on a portion of the shield region 110*a* and on a first portion of the drift region 120, the portion 132*b* is disposed on a portion of the shield region 110*b* and on a second portion of the drift region 120, and the first Schottky material 130 is disposed on a third portion of the drift region 120 between (and in contact with) the portion 132*a* and the portion 132*b*. In this example, the first Schottky material 130 can have a higher work function than a work function the second Schottky material layer. Accordingly, the Schottky contact 140 will have a barrier height that is greater than a barrier height of the Schottky contact 142*a* and the Schottky contact 142*b*. In example implementations, respective Schottky materials can each include one or more of a metal, an alloys, a silicide, a semiconductor material, or other materials with appropriate work functions for defining a Schottky barrier with a semiconductor material.

As shown in FIG. 1, the Schottky material 130 and the Schottky contact 140 have a width W1. In example implementations, the width W1 can be selected based on electric field distribution at a surface of the drift region 120 (e.g., electric field distribution under reverse-bias conditions) to achieve a desired relationship between on-state and off-state operating characteristic of the diode 100. In the following discussion, references to electric field electric field and electric field distribution refer, respectively, to electric field and electric field distribution under reverse-bias conditions, unless otherwise indicated.

In this example, as W1 is varied (widened or narrowed), an associated surface area of the drift region 120 on which the Schottky material 130 is disposed (an area of the Schottky contact 140) will vary (will respectively increase or decrease). Likewise, as W1 is varied, respective surface areas of the drift region 120 on which the portion 132*a* and the portion 132*b* are disposed (and respective areas of the Schottky contact 142*a* and the Schottky contact 142*b*) will also correspondingly vary. That is, increasing W1 will reduce the respective surface areas of the drift region 120 on which the portion 132*a* and the portion 132*b* are disposed, while decreasing W1 will increase the respective surface areas of the drift region 120 on which the portion 132*a* and the portion 132*b* are disposed.

In the diode 100, the electric field in the drift region 120 (e.g., just below, e.g., 5 nanometers or less below, the Schottky contact 140, 142*a* and 142*b*) will be highest at a mid-point between the shield region 110*a* and the shield region 110*b*, and will decrease moving away from the mid-point along the surface of the drift region 120, respectively, toward the shield region 110*a* and the shield region 110*b* (e.g., with a bell-shaped curve distribution). Accordingly, the Schottky material 130 in the diode 100 is disposed on a portion of the drift region 120 with the highest electric field for the diode 100, while the portion 132*a* and the portion 132*b* are disposed on areas of the drift region 120 with lower electric field.

As the Schottky contact 140, in this example, has a higher barrier height than the Schottky contacts 142*a* and 142*b*, a tradeoff between forward operating characteristics and reverse operating characteristics of the diode 100 can be improved, e.g., as compared to using only the Schottky material 130, or only the second Schottky material of the portion 132*a* and the portion 132*b*. For instance, in the diode 100, the width W1 of the Schottky material 130 can be adjusted such that respective leakage current density (e.g., total leakage current through a specific device portion divided by an area of that portion) of the Schottky contact 140, the Schottky contact 142*a* and the Schottky contact 142*b* are the same, or substantially the same (e.g., have a same design target), which will reduce the overall leakage current of the diode 100 as compared to a diode that is implemented using the only the second Schottky material (of the portion 132*a* and the portion 132*b*) with the lower barrier height. Further in the diode 100, the lower barrier height of the Schottky contact 132*a* and the Schottky contact 132*b* will reduce Vf of the diode 100 (e.g., reduce on-state conduction losses) as compared to diode that is implemented using only the Schottky material 130 with the higher barrier height. Accordingly, improved tradeoff between on-state operating characteristics and off-state operating state characteristics of a Schottky diode can be achieved by implementations of the diode 100.

As also shown in FIG. 1, the diode 100 includes a metal including a portion 134*a* and a portion 134*b*. The portion 134*a* and the portion 134*b* form, respectively, an Ohmic contact 144*a* with the shield region 110*a*, and an Ohmic contact 144*b* with the shield region 110*b*. In some implementations, the portions 134*a* and 134*b* can include one of the Schottky materials of the diode 100. In some implementations, the portions 134*a* and 134*b* can include a different metal, which can be deposited, annealed and/or silicided to form the Ohmic contacts 144*a* and 144*b*.

Figure 2:
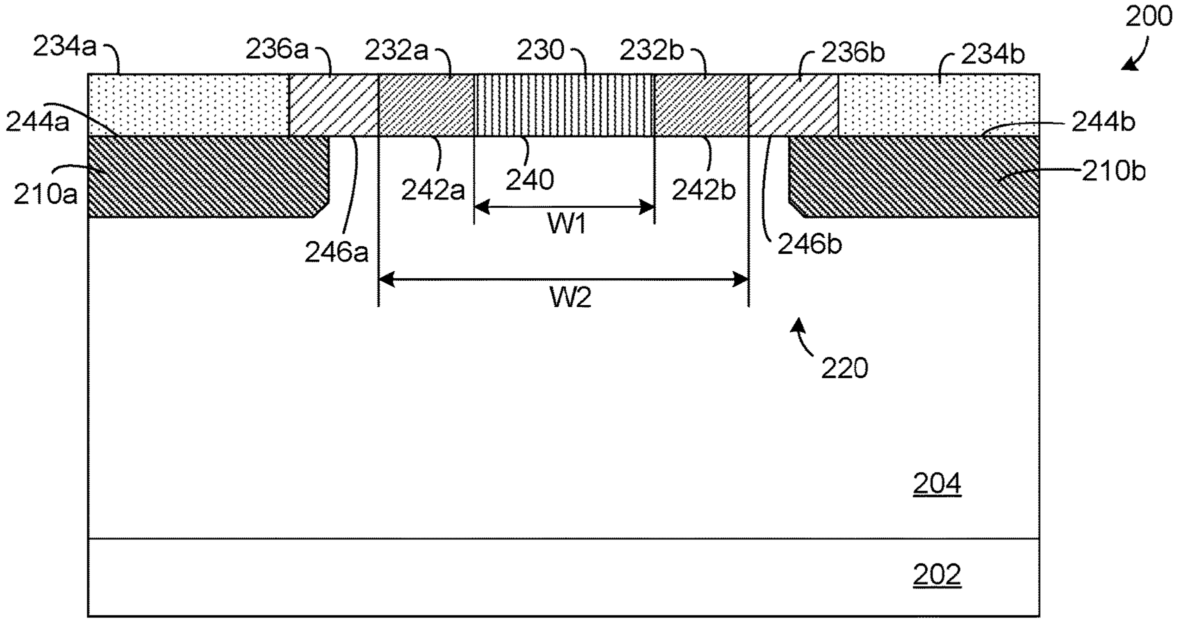
FIG. 2 is a diagram illustrating a cross-sectional view of another diode including Schottky contacts with different barrier heights, according to an implementation.

FIG. 2 is a diagram illustrating a cross-sectional view of another diode 200 including Schottky contacts with different barrier heights, according to an implementation. As with the diode 100, in some implementations, the diode 200 can have a linear (stripe) or linear cell design layout, e.g., into and/or out of the page. In some implementations, the cell layout of the diode 200 can be cellular (e.g., utilizing square, hexagonal, etc. diode cells), such as the example shown in FIG. 3. The diode 200 illustrates a single diode stripe or a single diode cell, which can be interconnected with other diode stripes or diode cells to form a larger diode. Depending on the particular implementation, the spacing, sizing and arrangement of the elements of the diode 200 can be different.

As shown in FIG. 2, the diode 200 includes a substrate 202 and a semiconductor layer 204 (semiconductor region). The substrate 202 and the semiconductor layer 204 can be of a first conductivity type, e.g., n-type conductivity. The substrate 202 can have a doping concentration that is higher than a doping concentration of the semiconductor layer 204. In some implementations, the semiconductor layer 204 can be an epitaxial semiconductor layer, or can include multiple epitaxial semiconductor layers with different doping concentrations. That is, in the view of FIG. 2, the upper portion of the semiconductor layer 204 can have a doping concentration that is higher than a doping concentration of the lower portion of the semiconductor layer 204. In some implementations, the substrate 202 and the semiconductor layer 204 can include silicon carbide, or other semiconductor materials.

The diode 200 includes a shield region 210*a* and a shield region 210*b* that are disposed in the semiconductor layer 204. The shield region 210*a* and the shield region 210*b* are disposed adjacent to a drift region 220 of the diode 200, where the drift region 220 is disposed between the shield region 210*a* and the shield region 210*b*. The shield region 210*a* and the shield region 210*b* of the diode 200 are of a second conductivity type that is opposite the first conductivity type, e.g., p-type conductivity. In some implementations, the first and second conductivity types can be reversed.

Similar to the diode 100, the diode 200 includes a first Schottky material 230 (a first Schottky material layer) that defines a Schottky contact 240 with the drift region 220 and a second Schottky material (a second Schottky material layer) that includes a portion 232*a* and a portion 232*b* that define, respectively, a Schottky contact 242*a* and a Schottky contact 242*b* with the drift region 220. The diode 200 further includes a third Schottky material (a third Schottky material layer) that includes a portion 236*a* and a portion 236*b* that define, respectively, a Schottky contact 246*a* and a Schottky contact 246*b* with the drift region 220. In this example, the first Schottky material 230 can have a higher work function than a work function of the second Schottky material layer, and the second Schottky material, e.g., portions 232*a* and 232*b*, can have a higher work function than a work function of the third Schottky material layer, e.g., the portions 236*a* and 236*b*. Accordingly, the Schottky contact 240 will have a barrier height that is greater than respective barrier heights of the Schottky contacts 242*a*, 242*b*, 246*a* and 246*b*, and the Schottky contacts 242*a* and 242*b* will have a barrier height that is greater than a barrier height of the Schottky contacts 246*a* and 246*b*. In some implementations, additional Schottky material layers with different work functions (e.g., lower work functions) can be included.

As shown in FIG. 2, the Schottky material 230 and the Schottky contact 240 have a width W1, while the Schottky material 230, the portion 232*a* and the portion 232*b*, together, have a width of W2. In example implementations, the widths W1 and W2 can be selected based on electric field distribution at a surface of the drift region 220 (e.g., electric field distribution under reverse-bias conditions) to achieve a desired relationship between on-state and off-state operating characteristic of the diode 200.

In this example, as W1 is varied (widened or narrowed), an associated surface area of the drift region 220 on which the Schottky material 230 is disposed (an area of the Schottky contact 240) will vary (respectively increase or decrease). Likewise, as W1 is varied, respective surface areas of the drift region 220 on which the portions 232*a*, 232*b*, 236*a* and 236*b* are disposed (and respective areas of their Schottky contacts 242*a*, 242*b*, 246*a* and 246*b*) will also correspondingly vary. That is, increasing W1 will reduce the surface area of the drift region 220 on which the portions 232*a*, 232*b*, 236*a* and 236*b* are disposed, while decreasing W1 will increase the surface areas of the drift region 220 on which the portions 232*a*, 232*b*, 236*a* and 236*b* are disposed. Also, as W2 is varied, respective surface areas of the drift region 220 on which the portions 236*a* and 236*b* are disposed (and respective areas of their Schottky contacts 246*a* and 246*b*) will also correspondingly vary. That is, increasing W2 will reduce the surface area of the drift region 220 on which the portions 236*a* and 236*b* are disposed, while decreasing W2 will increase the surface areas of the drift region 220 on which the portions 236*a* and 236*b* are disposed.

In the diode 200, as with the diode 100, the electric field in the drift region 220 (e.g., just below the Schottky contacts 240, 242*a*, 242*b*, 246*a* and 246*b*) will be highest at a mid-point between the shield region 210*a* and the shield region 210*b*, and will decrease moving away from the mid-point along the surface of the drift regions 220, respectively, toward the shield region 210*a* and the shield region 210*b* (e.g., with a bell-shaped curve distribution). Accordingly, the Schottky material 230 in the diode 200 is disposed on a portion of the drift region 220 with the highest electric field for the diode 200, while the portions 232*a*, 232*b*, 236*a* and 236*b* are disposed on areas of the drift region 220 with lower electric field.

As the Schottky contact 240, in this example, has a higher barrier height than the Schottky contacts 242*a* and 242*b*, and the Schottky contacts 242*a* and 242*b* have a higher barrier height than the Schottky contacts 246*a* and 246*b*, a tradeoff between forward operating characteristics and reverse operating characteristics of the diode 200 can be improved, e.g., as compared to using only the Schottky material 230, only the second Schottky material of the portions 232*a* and 232*b*, or only the third Schottky material of the portions 236*a* and 236*b*. For instance, in the diode 200, the widths W1 and W2 can be adjusted such that respective effective leakage current densities (e.g., total leakage current through a specific device area divided by the area) of the Schottky contacts 240, 242*a*, 242*b*, 246*a* and 246*b* are the same, or substantially the same (e.g., have a same design target), which will reduce the overall leakage current the diode 200 as compared to a diode that is implemented using the only the second Schottky material (of the portions 232*a* and 232*b*) or only the third Schottky material (of the portions 236*a* and 236*b*) with lower barrier heights. Further in the diode 200, the lower barrier height of the Schottky contacts 232*a*, 232*b*, 236*a* and 236 will reduce $V_f$ of the diode 200 (e.g., reduce on-state conduction losses) as compared to diode that is implemented using only the Schottky material 230 with the higher barrier height. Accordingly, improved tradeoff between on-state operating characteristics and off-state operating state characteristics of a Schottky diode can be achieved by implementations of the diode 200. In some implementations of the diode 200, leakage current densities through the Schottky contacts 242*a*, 242*b*, 246*a* and 246*b* can be less than a current density through the Schottky contact 240, while still providing the better tradeoff between on-state and off-state characteristics.

As also shown in FIG. 2, the diode 200 includes a metal including a portion 234*a* and a portion 234*b*. The portion 234*a* and the portion 234*b* form, respectively, an Ohmic contact 244*a* with the shield region 210*a*, and an Ohmic contact 244*b* with the shield region 210*b*. In some implementations, the portions 234*a* and 234*b* can include one of the three different Schottky materials of the diode 200. In some implementations, the portions 234*a* and 234*b* can include a different metal, which can be deposited, annealed and/or silicided to form the Ohmic contacts 244*a* and 244*b*.

Figure 3:
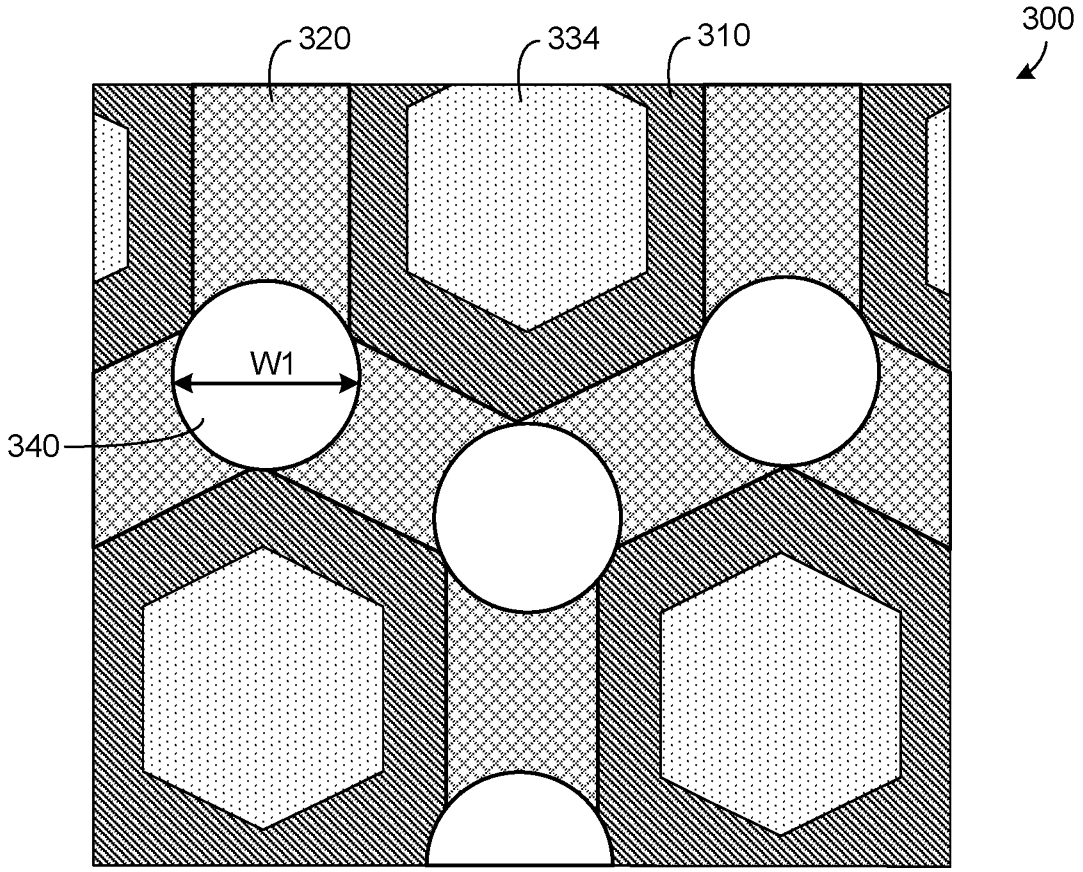
FIG. 3 is a diagram illustrating a top-down (plan) view of still another diode including Schottky contacts with different barrier heights, according to an implementation.

FIG. 3 is a diagram illustrating a top-down (plan) view of still another diode 300 including Schottky contacts with different barrier heights, according to an implementation. The view of the diode 300 shown in FIG. 3 is a portion of a diode having a cellular design. For purposes of illustration, the diode 300 is illustrated without metallization layers, e.g., pad metal, Schottky materials and/or Ohmic contact metal, so as not to obscure the underlying structure.

In the example of FIG. 3, the diode 300 includes hexagon shaped cells, where each cell includes a shield region 310, with a drift region 320 of the diode 300 being disposed between the hexagon shaped shield regions, e.g., as segments, streets, etc., having intersections of the drift region 320 between the hexagon shaped shield regions 310. That is, hexagon shaped drift region portions surround each shield region 310. In the diode 300, the highest electric field will occur at these intersections of the drift region portions 320, which are noted as region 340 in FIG. 3. The diode 300 also includes an Ohmic contact region 334 disposed within the shield region 310. In this example, a first Schottky material can be disposed on the regions 340 and a second Schottky material can be disposed on the remaining portions of the drift region 320, as well as at portions of the shield regions 310. Ohmic contacts, in the Ohmic contact regions 334 can formed using either one of the two Schottky materials, or another metal, such described above with respect to FIGS. 1 and 2.

In the diode 300, the first Schottky material forms Schottky contacts with higher barrier heights (at the regions 340) than Schottky contacts formed with the second Schottky material on the remaining portions of the drift region 320. A width W1 the regions 340 (analogous with the width W1 in the diode 100) can be varied to achieve desired operating characteristics of the diode 300. For instance, increasing W1 in the diode 300 will reduce an area of the drift region 320 the diode 300 on which the second Schottky material is disposed, while decreasing W1 in the diode 300 will increase an area of the drift region 320 the diode 300 on which the second Schottky material is disposed. In some implementations, the width W1 of the regions 340 can be selected such that leakage current density through each of the regions 340 is the same as, or substantially the same (e.g., has a same design target) as respective leakage current density through each of the segments of the drift region 320 between each region 340. In some implementations, the width W1 of the regions 340 can be selected such that leakage current density through each of the regions 340 is the lower than respective leakage current density through each of the segments of the drift region 320 between each region 340. Further, in some implementations, additional Schottky materials can be used in the regions 340, such as described with respect to the diode 200 of FIG. 2.

Figure 4:
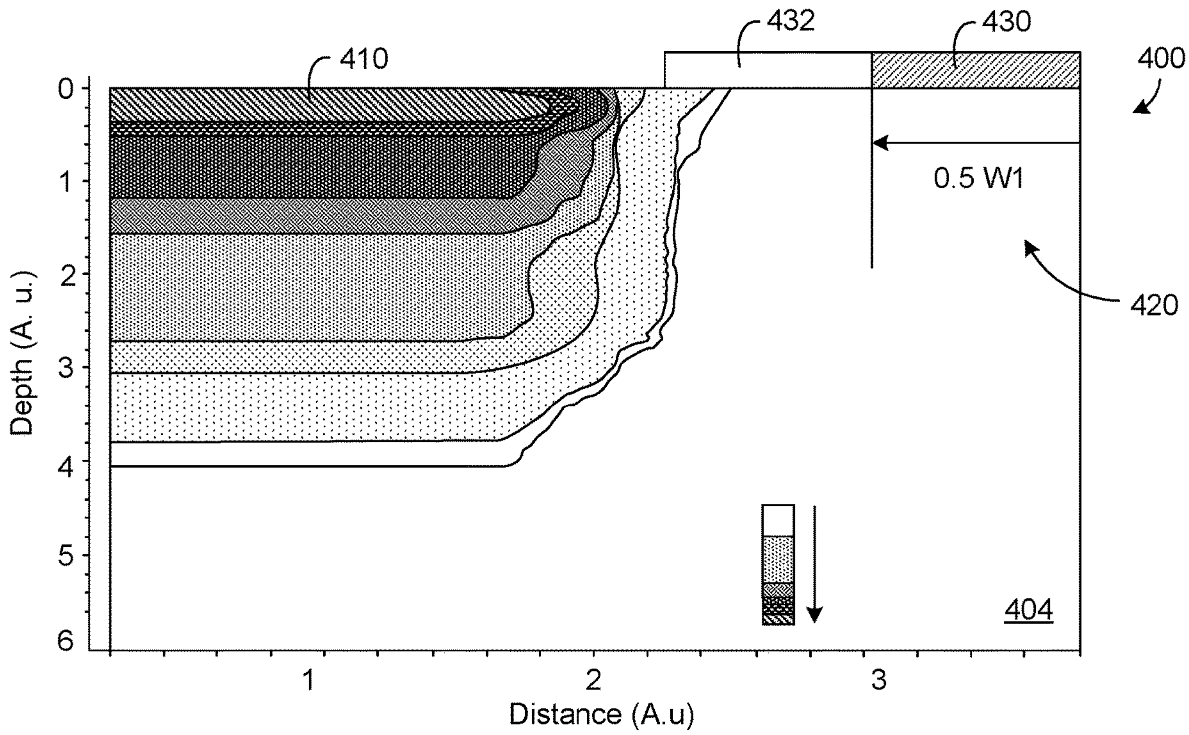
FIG. 4 is a diagram illustrating a cross-sectional view of a doping distribution of a diode portion (e.g., half diode portion) including Schottky contacts with different barrier heights, such as the diode of FIG. 1.

FIG. 4 is a diagram illustrating a cross-sectional view of a doping distribution of a diode portion 400 (e.g., half a diode's cell having a linear/stripe design stripe or cell) including Schottky contacts with different barrier heights, such as could be used to implement the diodes described herein. In example implementations, the diode portion 400 can be mirrored on the right and/or left to produce full and/or additional diode stripes or cells. The legend in FIG. 4 indicates relative doping concentrations for a conductivity type (e.g., p-type conductivity) in a shield region 410 of the diode portion 400, where doping concentration increases in the direction of the arrow. In this example, relative doping concentrations for a conductivity type (e.g., n-type conductivity) for the drift region 420 (and below the shield region 410) are not specifically shown. Such doping concentrations will both depend on the specific implementation.

As shown in FIG. 4, the diode portion 400 includes a semiconductor layer 404 of the first conductivity type (e.g., n-type conductivity) and a shield region 410 of the second conductivity type (e.g., p-type conductivity). In some implementations, these conductivity types can be reversed. A first Schottky material 430 is disposed on a first portion of the drift region 420 of the diode portion 400, where the first Schottky material 430 has a width of 0.5 W1, e.g., half the width W1 in FIG. 1, as the diode portion 400 is a half diode segment or cell. A second Schottky material 432 is disposed on a second portion of the drift region 420 and a portion of the shield region 410. As in the diode 100 of FIG. 1, the first Schottky material 430 forms a Schottky contact with the drift region 420 that has a barrier height that is greater than a barrier height of a Schottky contact with the drift region 420 formed by the second Schottky material 432. Metal defining an Ohmic contact with the shield region 410 is omitted in FIG. 4.

In FIG. 4, distance in arbitrary units (A.U.) is shown on the x-axis and depth A.U. is shown on the y-axis. The distance and depth in FIG. 4 are shown by way of reference, and will vary depending on the particular implementation. In the example of FIG. 4, distance along the x-axis indicates left to right distance along the diode portion 400 and corresponds with distance for a graph of electric field distribution for the diode portion 400 shown in FIG. 5. Depth in FIG. 4 indicates depth in the semiconductor layer 404, which can be an portion of an epitaxial semiconductor layer, such as those described herein.

Figure 5:
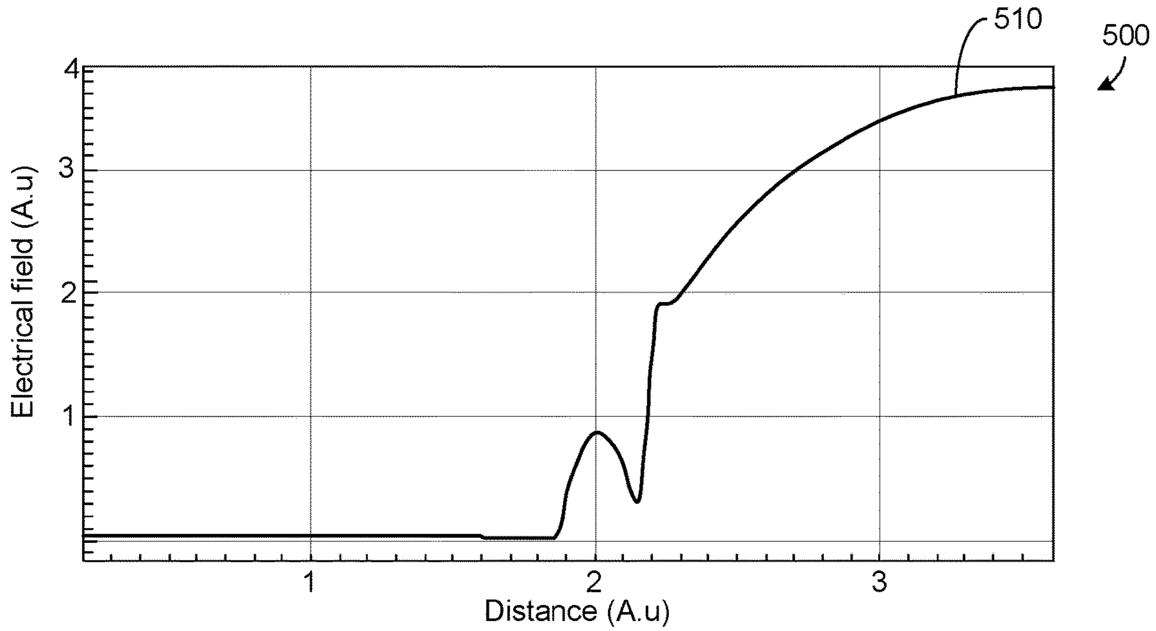
FIG. 5 is a graph illustrating an example of electric field under the Schottky contacts of an implementation of the diode of FIG. 4 (or FIG. 1) under reverse-bias condition.
Figure 6:
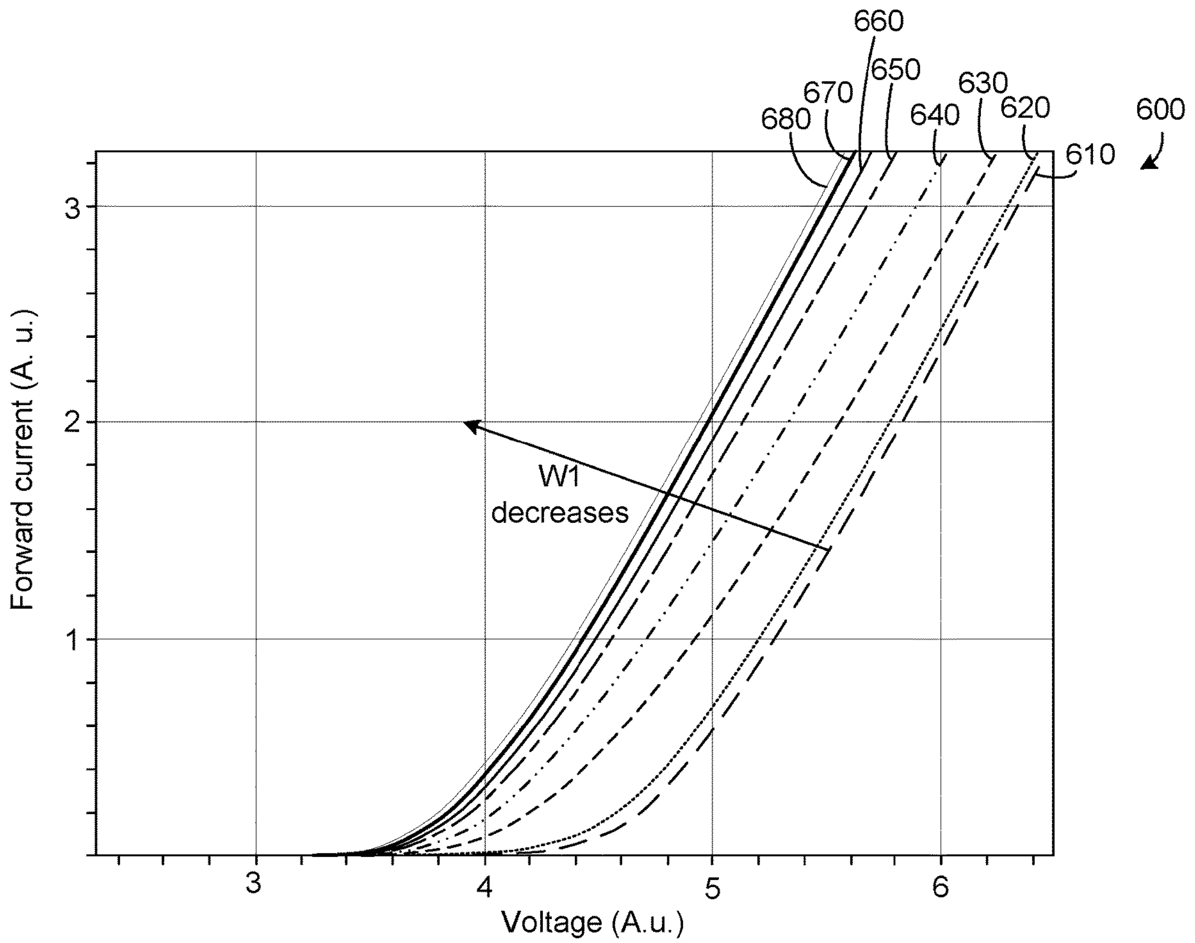
FIG. 6 is graph illustrating forward IV characteristics for implementations of the diode of FIG. 1 compared to a prior diode implementation.
Figure 7:
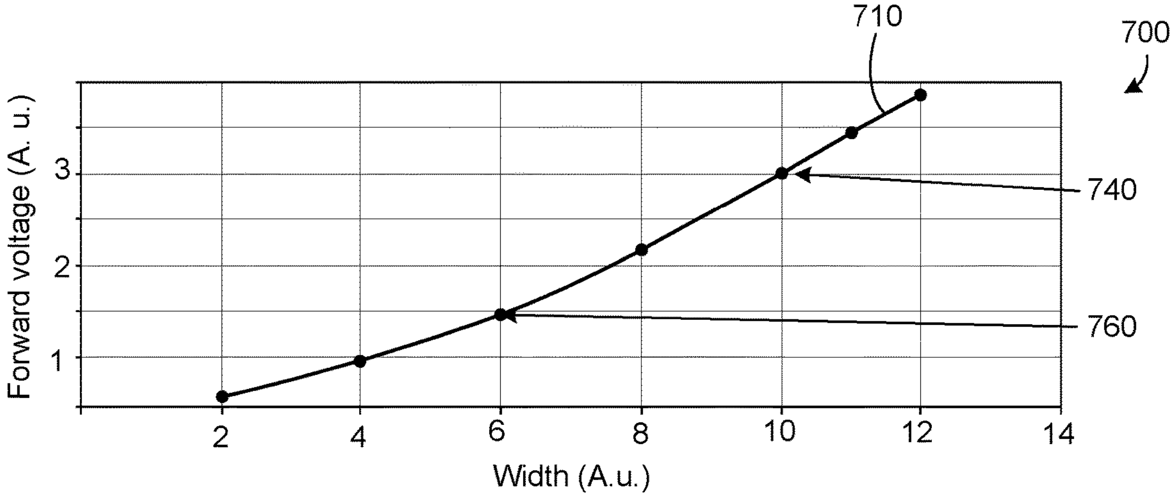
FIG. 7 is a graph illustrating forward voltage drop for diode implementations illustrated in FIG. 6.

FIGS. 5-7 are graphs illustrating operating characteristics of implementations of diodes including Schottky contacts with different barrier heights, such as implementations of the diode 100 of FIG. 1 (e.g., using the diode portion 400), though the aspects of FIGS. 5-7 described below similarly apply to other diodes, such as the example diode implementations described herein. Specifically, FIG. 5 is a graph 500 illustrating electric field distribution along the semiconductor surface under the Schottky contacts of an implementation of the diode portion 400 of FIG. 4 (or the diode 100 of FIG. 1) under reverse-bias conditions. FIG. 6 is graph illustrating IV curves (e.g., forward operating characteristics) for implementations of the diode of FIG. 1, e.g., based on the diode portion 400, compared to a prior diode implementation. FIG. 7 is a graph illustrating forward voltage drop for diode implementations illustrated in FIG. 6.

Referring to FIG. 5, an electric field distribution 510 is shown for an implementation of the diode portion 400 under reverse bias conditions. The applied reverse-bias voltage will vary depending on the particular device implementation (e.g. a diode's voltage rating) and operating conditions. In some implementations, the reverse-bias voltage can be 500 volts (V) or greater. The electric field distribution 510 shown in FIG. 5 illustrates electric field in the diode portion 400 just below an upper surface of the semiconductor layer 404 (e.g. 5 nm below the upper surface) along the semiconductor surface under the Schottky contacts. As noted above, the distance along the x-axis in FIG. 5 corresponds with the distance along the x-axis in FIG. 4 for the diode portion 400 using the same A.U. scale. Electric field, as a function of distance, is shown on the y-axis in A.U. As shown in FIG. 5, electric field remains negligible in the shield region 410 until the distance approaches an interface between the shield region 410 and the drift region 420, where the electric field begins to increase. After an initial step increase in electric field at the interface between the shield region 410 and the drift region 420, electric field continues to increase, reaching a peak at the right edge of the graph 500, which corresponds with the point of highest electric field. For instance, the peak electric field shown in FIG. 5 would correspond with a peak in electric field at a center of the Schottky contact 140 of the diode 100 (e.g., at a center of the drift region 120).

The width W1 (or 0.5 W1 in FIG. 5) can be selected based on this electric field distribution. For instance, in some implementations, the width W1 can be selected such that an interface between the first Schottky material 430 and the second Schottky material 432 is located at a distance along the x-axis where the electric field is twenty-five percent less than the peak electric field. In such implementations, leakage current can be reduced significantly (e.g., 5-10 times) as compared to a similarly sized diode that is implemented using only a Schottky material with lower barrier height Schottky contact, such as the second Schottky material 432.

Referring to FIG. 6, a graph 600 illustrating IV curves (forward operating characteristics) for various Schottky diode implementations is shown. In the graph 600, voltage (forward voltage) is shown along the x-axis in A.U., and current is shown along the y-axis in A.U. In the graph 600, the trace 610 shows an IV curve for a Schottky diode including only a single, high barrier height, Schottky material such as the Schottky material 130 of the diode 100. That is, the trace 610 illustrates on-state operation for an implementation of the diode 100 where the width W1 extends across the entire upper portion of the drift region 120 (e.g., there are no Schottky contacts formed with the lower barrier, second Schottky material, and the portions **132*a* and 132*b*** are omitted).

In FIG. 6, traces 620, 630, 640, 650, 660 and 670 illustrate forward operating characteristics for implementations of the diode 100 as the width W1 is decreased (as is indicated in FIG. 1) and the area of the drift region 120 on which the lower barrier height Schottky material (portions **132*a* and 132*b*) increases. As shown in FIG. 6, as W1** decreases, current for a given forward voltage increases, illustrating the benefit of the approaches described here of using multiple Schottky contacts with different barrier heights for improving the tradeoff between forward operating characteristics and reverse operating characteristics.

Referring to FIG. 7 a graph 700 illustrating the dependence of forward voltage drop $V_f$ (at a fixed forward current density) on the width W1 for implementations of the diode 100, such as those illustrated by the traces 620-680 in FIG. 6. In FIG. 7, the width W1 is shown along the x-axis in A.U., while corresponding V f values are shown on the y-axis in A.U. As shown in FIG. 7, as W1 decreases, V f also decreases. In the graph 700, the points 740 and 760 correspond respectively with the traces 640 and 660 in FIG. 6. In some implementations, a reduction in $V_f$ of approximately four to ten percent can be achieved as compared to the diode implementation illustrated by the trace 610 (e.g., a diode including only a high barrier height Schottky material). Such reductions in $V_f$ can allow for reducing an overall size of a Schottky diode to achieve a desired forward operation current density, which can reduce overall manufacturing costs.

Figure 8:
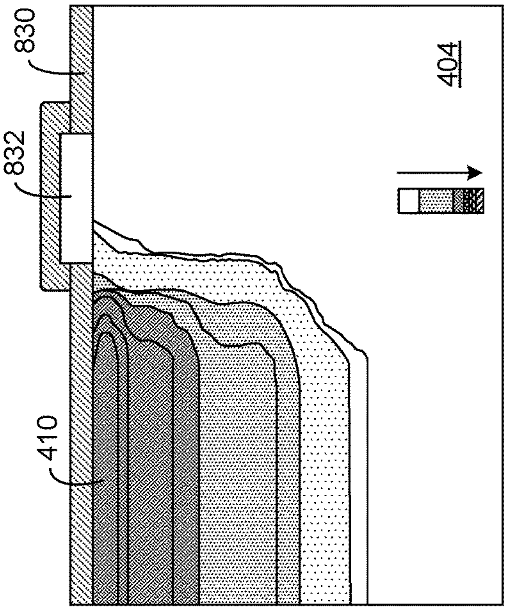
FIG. 8 is a diagram illustrating a cross-sectional view of an approach for forming Schottky contacts and an Ohmic contact of the diode portion of FIG. 4.

FIG. 8 is a diagram illustrating a cross-sectional view of an approach for forming Schottky contacts and an Ohmic contact of the diode portion 400 of FIG. 4. As shown in FIG. 8, a Schottky material 832 (lower barrier height Schottky material) can be deposited and patterned on the diode portion 400. After patterning the Schottky material 832, a Schottky material 830 (higher barrier height Schottky material) can be formed and patterned, where the Schottky material 832 also forms an Ohmic contact to the shield region 410. In some implementations, a different metal can be used to form an Ohmic contact to the shield region 410.

Figure 9:
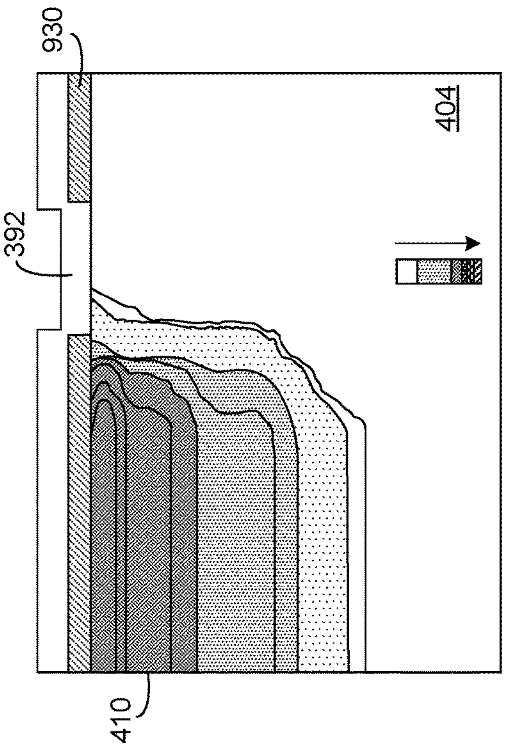
FIG. 9 is a diagram illustrating a cross-sectional view of another approach for forming Schottky contacts and an Ohmic contact of the diode portion of FIG. 4.

FIG. 9 is a diagram illustrating a cross-sectional view of another approach for forming Schottky contacts and an Ohmic contact of the diode portion 400 of FIG. 4. As shown in FIG. 8, a Schottky material 930 (higher barrier height Schottky material) can be deposited and patterned on the diode portion 400. After patterning the Schottky material 930, a Schottky material 932 (higher barrier height Schottky material) can be formed and patterned. In this example, the Schottky material 930 forms an Ohmic contact to the shield region 410, and the Schottky material 932 is formed over the Schottky material 930, including the portion of the Schottky material 930 used to form the Ohmic contact. In some implementations, a different metal can be used to form an Ohmic contact to the shield region 410.

Figure 10:
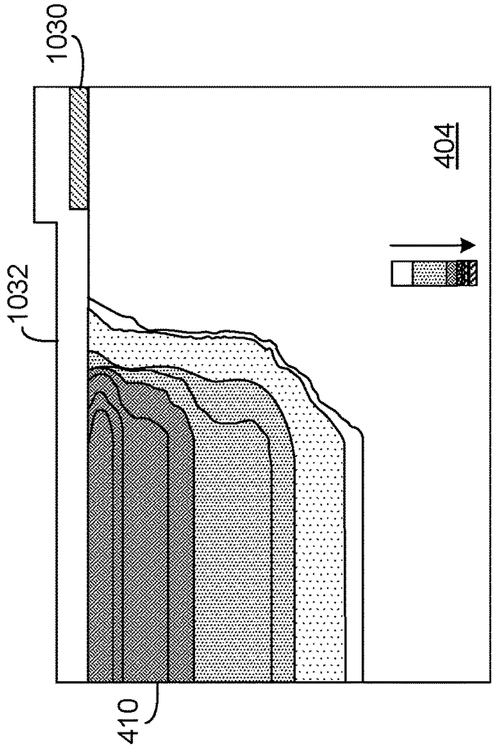
FIG. 10 is a diagram illustrating a cross-sectional view of yet another approach for forming Schottky contacts and an Ohmic contact of the diode portion of FIG. 4.

FIG. 10 is a diagram illustrating a cross-sectional view of yet another approach for forming Schottky contacts and an Ohmic contact of the diode portion 400 of FIG. 4. As shown in FIG. 10, a Schottky material 1030 (higher barrier height Schottky material) can be deposited and patterned on the diode portion 400. After patterning the Schottky material 830, a Schottky material 1032 (lower barrier height Schottky material) can be formed and patterned, where the Schottky material 1032 also forms an Ohmic contact to the shield region 410. In some implementations, a different metal can be used to form an Ohmic contact to the shield region 410.

Figure 11:
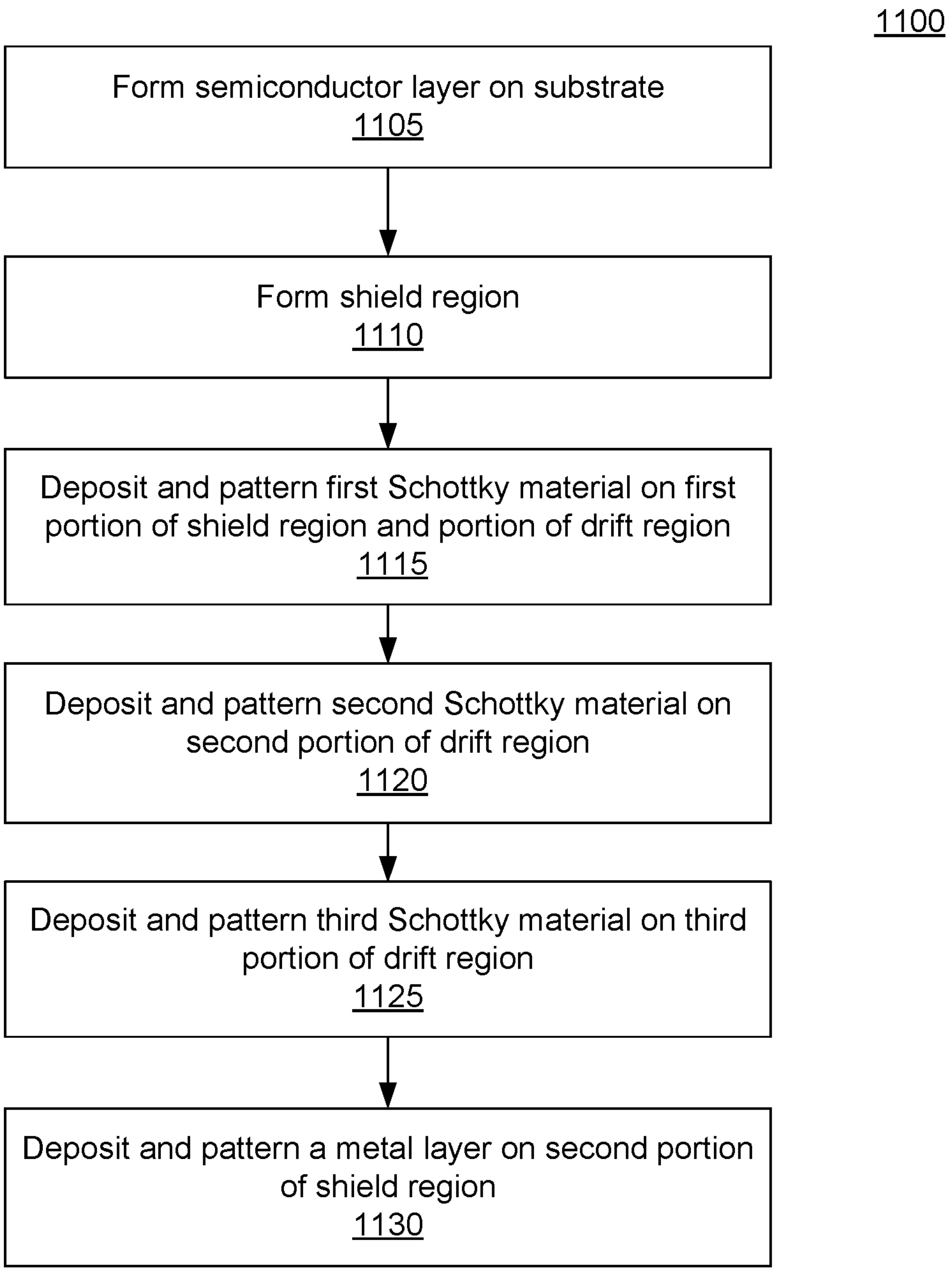
FIG. 11 is a flowchart illustrating a method 1100 for producing a Schottky diode with Schottky contacts of different barrier heights, such as the diodes of FIGS. 1 to 4.

FIG. 11 is a flowchart illustrating a method 1100 for producing a Schottky diode with Schottky contacts of different barrier heights, such as the diodes of FIGS. 1 to 4. More or fewer operations than shown can be performed. Two or more operations can be performed in a different order unless otherwise indicated.

At operation 1105, the method 100 includes forming a semiconductor layer of a first conductivity type disposed on a substrate of the first conductivity type. The semiconductor layer can be an epitaxial layer that has a doping concentration that is less than a doping concentration of the substrate. The semiconductor layer can include a drift region of the Schottky diode. At operation, 1110, the method 1100 includes forming a shield region of a second conductivity type in the semiconductor layer adjacent to the drift region. At operation 1115, the method 1100 includes depositing and patterning, e.g., using photolithography techniques, a first Schottky material on at least a portion of the shield region and on a first portion of the drift region. The first Schottky material can define a first Schottky contact with the drift region. At operation 1120, the method 1100 includes depositing and patterning a second Schottky material disposed on a second portion of the drift region, the second Schottky material being adjacent to the first Schottky material, the second Schottky material defining a second Schottky contact with the drift region. In example implementations, the first Schottky contact can have a first barrier height, the second Schottky contact can have a second barrier height, and the first barrier height can be less than the second barrier height.

As operation 1125, the method 1100 includes depositing and patterning a third Schottky material on a third portion of the drift region. The third Schottky material can define a third Schottky contact with the drift region, and can be adjacent to the second Schottky material. The second Schottky material can be disposed between the first Schottky material and the third Schottky material. The third Schottky contact can have a third barrier height that is greater than the second barrier height.

The at least a portion of the shield region of operation 1115 can be a first portion of the shield region, and the method 1100 can include, at block 1130, depositing and patterning a metal layer on a second portion of the shield region, where the metal layer can define an ohmic contact to the shield region. In some implementations, the metal layer can include one of the first Schottky material, the second Schottky material, or the third Schottky material.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments.

What is claimed is:

1. A diode comprising:

a substrate of a first conductivity type;

a semiconductor layer of the first conductivity type disposed on the substrate, the semiconductor layer including a drift region of the diode;

a shield region of a second conductivity type disposed in the semiconductor layer adjacent to an upper portion of the drift region;

a first Schottky material disposed on a first portion of the shield region and on a first portion of the upper portion of the drift region, the first Schottky material defining a first Schottky contact with the drift region;

a second Schottky material disposed on a second portion of the drift region, the second Schottky material being adjacent to the first Schottky material, the second Schottky material defining a second Schottky contact with the drift region, the first Schottky contact having a first barrier height, the second Schottky contact having a second barrier height, the first barrier height being less than the second barrier height; and a metal deposited on a second portion of the shield region and defining an ohmic contact to the shield region, wherein the metal is different from the first Schottky material.

2. The diode of claim 1, further comprising:

a third Schottky material disposed on a third portion of the drift region, the third Schottky material defining a third Schottky contact with the drift region, the third Schottky material being adjacent to the second Schottky material, the second Schottky material being disposed between the first Schottky material and the third Schottky material, the third Schottky contact having a third barrier height that is greater than the second barrier height.

3. The diode of claim 1, wherein:

the first conductivity type is n-type; and the second conductivity type is p-type.

4. The diode of claim 1, wherein:

the substrate is a silicon carbide substrate; and the semiconductor layer is an epitaxial silicon carbide layer, the substrate having a doping concentration that is higher than a doping concentration of the epitaxial silicon carbide layer.

5. The diode of claim 1, wherein the metal disposed on the second portion of the shield region includes the second Schottky material.

6. The diode of claim 1, wherein the shield region is one of a plurality of hexagonally shaped shield regions arranged in a cellular layout, and wherein the drift region includes a hexagonal pattern.

7. The diode of claim 1, wherein respective top surfaces of the metal, the first Schottky material, and the second Schottky material are coplanar.

8. A diode comprising:

a substrate of a first conductivity type;

a semiconductor layer of the first conductivity type disposed on the substrate;

a plurality of shield regions of a second conductivity type disposed in the semiconductor layer, the plurality of shield regions including a first shield region and a second shield region separated by a drift region;

a first Schottky material layer having:

a first portion disposed on a first portion of the first shield region and on a first portion of the drift region, and defining a first Schottky contact with the drift region; and a second portion disposed on at least a portion of the second shield region and on a second portion of the drift region, and defining a second Schottky contact with the drift region;

a second Schottky material layer disposed on a third portion of the drift region, the second Schottky material layer being disposed, at least in part, between the first portion of the first Schottky material layer and the second portion of the first Schottky material layer, and defining a third Schottky contact with the drift region, the first Schottky contact and the second Schottky contact having a first barrier height, the third Schottky contact having a second barrier height, the first barrier height being less than the second barrier height; and a metal deposited on a second portion of the first shield region and defining an ohmic contact to the first shield region, wherein the metal is adjacent to and different from a Schottky material of the first Schottky material layer.

9. The diode of claim 8, further comprising:

a third Schottky material layer having:

a first portion disposed on a fourth portion of the drift region and defining a fourth Schottky contact with the drift region, the first portion of the third Schottky material layer being disposed between the first portion of the first Schottky material layer and the second Schottky material layer; and a second portion disposed on a fifth portion of the drift region and defining a fifth Schottky contact with the drift region, the second portion of the third Schottky material layer being disposed between the second portion of the first Schottky material layer and the second Schottky material layer, the fourth Schottky contact and the fifth Schottky contact having a third barrier height, the third barrier height being less than the second barrier height and greater than the first barrier height.

10. The diode of claim 8, wherein:

the first conductivity type is n-type; and the second conductivity type is p-type.

11. The diode of claim 8, wherein:

the substrate is a silicon carbide substrate; and the semiconductor layer is an epitaxial silicon carbide layer, the substrate having a doping concentration that is higher than a doping concentration of the epitaxial silicon carbide layer.

12. The diode of claim 8, wherein the metal disposed on the second portion of the first shield region includes a second Schottky material of the second Schottky material layer.

13. The diode of claim 8, wherein the at least a portion of the second shield region is a first portion of the second shield region, the diode further comprising:

a metal disposed on a second portion of the second shield region and defining an ohmic contact to the second shield region.

14. The diode of claim 8, wherein the drift region separating the first shield region and the second shield region is a first drift region, the diode including:

a third shield region of the plurality of shield regions, the third shield region being separated from the first shield region by a second drift region; and the first Schottky material layer having a third portion disposed on at least a portion of the first shield region, the second drift region, and at least a portion of the third shield region, and defining a third Schottky contact with the second drift region, the third Schottky contact having a third barrier height less than the second barrier height.

15. The diode of claim 8, wherein the plurality of shield regions are hexagonally shaped shield regions, and wherein the plurality of shield regions are arranged as cells of a hexagonal lattice.

16. A diode comprising:

a substrate of a first conductivity type;

a semiconductor layer of the first conductivity type disposed on the substrate;

a plurality of shield regions of a second conductivity type disposed in the semiconductor layer and arranged in a cellular layout, the plurality of shield regions including a first shield region, a second shield region, and a third shield region;

a drift region disposed in the semiconductor layer, the drift region including:

a first portion separating the first shield region from the second shield region;

a second portion separating the second shield region from the third shield region;

a third portion separating the third shield region from the first shield region; and a fourth portion central to the first shield region, the second shield region, and the third shield region;

a first Schottky material layer disposed on the first portion, the second portion, and the third portion of the drift region and forming one or more first Schottky contacts having a first barrier height; and a second Schottky material layer disposed on the fourth portion of the drift region and forming a second Schottky contact having a second barrier height greater than the first barrier height.

17. The diode of claim 16, further comprising a metal Ohmic contact formed on each of the first shield region, the second shield region, and the third shield region, the metal Ohmic contact formed of a deposited metal that is different from a first Schottky material of the first Schottky material layer and a second Schottky material of the second Schottky material layer.

18. The diode of claim 16, wherein:

the substrate is a silicon carbide substrate; and the semiconductor layer is an epitaxial silicon carbide layer, the substrate having a doping concentration that is higher than a doping concentration of the epitaxial silicon carbide layer.

19. The diode of claim 16, wherein the plurality of shield regions are hexagonally shaped shield regions, and wherein the cellular layout includes a hexagonal lattice.

20. The diode of claim 19, wherein the drift region defines a hexagonal pattern.

* * * * *